(12) United States Patent  
Osterweil

(10) Patent No.: US 8,847,580 B1  
(45) Date of Patent: Sep. 30, 2014

(54) TAMPERPROOF MAGNETIC PROXIMITY SENSOR

(76) Inventor: Josef Osterweil, Rockville, MD (US)

(*) Notice: Subject to any disclaimer, the term of this patent is extended or adjusted under 35 U.S.C. 154(b) by 847 days.

(21) Appl. No.: 12/932,767

(22) Filed: Mar. 7, 2011

Related U.S. Application Data

(60) Provisional application No. 61/340,377, filed on Mar. 17, 2010.

(51) Int. Cl.
   *G01B 7/14* (2006.01)
   *G01R 33/12* (2006.01)
   *H01H 9/00* (2006.01)

(52) U.S. Cl.
   USPC ............... 324/207.11; 324/207.13; 324/222; 335/205

(58) Field of Classification Search
   USPC .................................... 324/207.11
   See application file for complete search history.

(56) References Cited

U.S. PATENT DOCUMENTS

| | | | |
|---|---|---|---|
| 4,210,888 A | 7/1980 | Holce | 335/207 |
| 4,745,383 A | 5/1988 | Zovath et al. | 335/181 |
| 4,858,622 A | 8/1989 | Osterweil | 128/782 |
| 5,668,533 A | 9/1997 | Jackson, Jr. et al. | 340/547 |
| 5,874,878 A | 2/1999 | Jackson, Jr. | 335/205 |
| 5,877,664 A | 3/1999 | Jackson, Jr. | 335/205 |
| 5,929,731 A | 7/1999 | Jackson, Jr. | 335/207 |
| 6,313,724 B1 | 11/2001 | Osterweil | |
| 7,218,194 B2 | 5/2007 | Habboosh | 335/205 |
| 7,248,136 B2 | 7/2007 | Habboosh | 335/205 |
| 7,280,017 B2 | 10/2007 | Yuze et al. | 335/151 |

*Primary Examiner* — Bot Ledynh

(57) ABSTRACT

An apparatus and method of a tamperproof magnetic proximity sensor based on a magnetically shielded magnetic sensor. The proximity sensor is substantially impervious to external magnetic field and is protected by external magnetic sensors for preemptive detection of external magnetic field tamper attempts.

20 Claims, 17 Drawing Sheets

Protected Area

→ Opening Direction

TAMPERPROOF MAGNETIC PROXIMITY SENSOR

1. RELATED DATA

The present invention is related to the provisional application TAMPERPROOF MAGNETIC PROXIMITY SENSOR No. 61/340,377 filed on Mar. 17, 2020.

2. FIELD OF THE INVENTION

This invention relates to a magnetic proximity sensor with novel features for tamperproof high security application. It is based on a ferromagnetic enclosure, containing a strong magnet and a sensor. The enclosure shields the sensor from effects of external magnetic field tampering. Additional sensors outside the enclosure detect external magnetic fields tamper attempts and attempt to move the sensor from its mounted position.

3. BACKGROUND AND RELATED INFORMATION

Magnetic proximity sensing has been used for many years. There are many different magnetic proximity sensor concepts in use today including, static threshold, transient, electromagnetic, and solid-state. The list of prior art for magnetic proximity sensing applications is very long and includes security systems, automation, instrumentation, etc. These include a number of different approaches for tamperproof applications, primarily in high security systems. A sensing device such as a reed switch, other mechanical magnetic switch, such as the Magnasphere®, Hall Effect sensor, magneto-resistive sensor or other solid-state device is used for sensing the strength of the magnetic field or the resulting magnetic flux flow.

Most proximity sensors require two devices, one attached to each of the two elements (physical entities) whose relative proximity to each other is sensed. These devices typically comprise a permanent magnet opposite a reed switch, as is commonly used in security systems. These devices are vulnerable to external magnetic field that can defeat their integrity of maintaining security. Other methods of tampering include removing both the magnet and the sensor of the protected door, widow, etc., while maintaining the proximity and orientation between them.

SUMMARY OF THE INVENTION

The instant invention applies the properties of magnetism in a novel manner that expands on attempts to tamperproof magnetic proximity sensors for use primarily in high security systems. A magnetic sensor assembly of the present invention comprises two elements, a stationary element, the "Dome" (the sensor element), and a moving element, the "Shell" (the magnetic field source element) that are each enclosed in its own high permeability shield generally in a circular manner around their common vertical axis. The high permeability shield Shell houses a permanent magnet and optional high permeability flux guiding member. A reed switch is placed in the Dome. Note that other magnetic sensors, such as, but not limited to, Magnasphere®, Hall Effect, magneto-resistive sensor, flux gate, etc., are within the scope and spirit of the present invention and will be used interchangeably. Future terminology in the present invention will refer to "reed switch" or "flux sensor" to indicate any magnetic sensor. Additionally, terms like switch, sensor, detector, etc., will be used interchangeably. Each of the circular enclosures of the two elements is made of high permeability material. These enclosures nearly eliminate the impact of any external magnetic field. The thickness of the Shell and the Dome and their permeability are proportional to their immunity against external flux effects whereas their flux saturation properties adversely affect the immunity of the proximity sensor to external magnetic fields.

The primary objectives of the instant invention are to eliminate the tampering with the proximity sensor by using an external magnetic field of any orientation, no mater how strong and whether the tampering is attempted from indoors or outdoors of the protected area. In addition, a measure is disclosed for detecting the removal of the two elements from their mounted position while, at the same time, maintaining their relative proximity and orientation, which would simulate secure status when it does not really exist. Furthermore, tampering with the sensor by inserting a custom configured magnet that would fit in the air gap between the elements while the door, for example, is open is not effective because of the internal structure of the Dome. The Dome, by virtue of an adjustable reed switch air gap, determines the sensitivity of the switch and therefore requires a strong magnetic field that cannot be delivered by a magnet that fits in the air gap between the Dome and the Shell.

A feature of the present invention is that the high permeability enclosures and internal flux guiding members enhance the flux lines along the desired paths within the enclosures while retarding any external flux sources which would affect the internal workings of the sensor.

An additional feature of the present invention is the introduction of active components such as Hall Effect Magnetoresistors, etc., to replace the passive reed switch while allowing two wires to interconnect as is commonly used with passive/mechanical devices. The two wires carry, for example, both DC and AC. The DC is used, for example, for status sensing and the AC then will be used as a source of power to the active circuitry within the proximity sensor.

Yet an additional feature of the present invention is the introduction of a tamperproof mechanism using the active components to allow the adjustment of the sensitivity if the secured proximity sensor changes by aging or, for example, door sagging, thus changing the size of the air gap. This feature provides a narrow tolerance for flux variation at the active device, for example Hall Effect sensor. When the sensor detects flux strength outside of the allowed tolerance, the status is interpreted as loss of security.

The active sensors are typically based on semiconductor technology and are capable of "soft sensing" (determining condition and degree of condition) unlike the binary sensing of a typical reed switch. This feature measures the flux magnitude as a function of position (degree of proximity) in accordance with the curve characteristics of the soft sensor. Environmental sensors can further clarify and predict variations in soft sensing intensity.

An additional feature of the present invention is the introduction of a reed switch outside the Dome. The switch can be oriented in any desired direction for detecting even minor magnetic flux that can be construed as a tamper attempt. Three switches placed in a mutually orthogonal positioning can detect flux of any orientation.

Yet an additional feature of the present invention is the introduction of an interlock bracket to the Dome housing that is mounted underneath it and is not visible or accessible when the sensor element (Dome housing) is mounted covering the bracket. In order to remove the interlock bracket, the Dome housing must be removed first. The disengagement of the sensor element from the bracket interrupts the interlock mechanism and is identified by a central control unit as a tamper attempt.

An additional feature of the present invention is the introduction of Dome housing local signal processing such as, but not limited to, alert pulse stretching or latching, so that even the shortest alert conditions are captured and conveyed to the Premises Control Unit without being affected by line parasitic low-pass filtering due to parasitic capacitance or other filtering properties.

And yet an additional feature of the present invention is the introduction of Dome housing status indicators in situ that provide an additional measure of proper operation verification.

Yet an additional feature of the present invention is the introduction of digital communication between the Dome housing and the Premises Control Unit. Communication from the Dome housing to the Premises Control Unit can provide additional status information regarding intrusion or tampering mode, as well as proximity sensor health and well-being such as, but not limited to, changes of flux level due to door sagging. Communication from the Premises Control Unit to the Dome housing can reset latched alert condition, trigger calibration and perform other housekeeping functions such as unit identification, etc.

An additional feature of the present invention is the introduction of additional wires (above the minimum number of two), such as, but not limited to, a USB link between the proximity sensor and the Premises Control Unit allowing an additional communication means between them.

An additional feature of the present invention is that the movement of the Dome housing from its mounted position is registered at the Premises Control Unit either at the moment of movement, if the electrical protection (supervisory circuit) is turned on or, at the moment the electrical protection (supervisory circuit) is turned on, if movement occurs while the protection (supervisory circuit) is turned off. The later is accomplished by utilizing the hysteresis of the movement sensor. For example, the hysteresis of a reed switch is manifested by its being turned on at a given magnetic induction level, (magnetic field) and for turning the switch off, the induction level is at a noticeably lower level. The difference between the "turn-on" level and "turn-off" level is defined as the hysteresis. While the reed switch is held at an induction level that is between the turn-on and turn-off induction level (the neutral zone), the switch maintains the on or off state based on its state before entering the neutral zone. This constitutes a nonvolatile memory that can be read by the Premises Control Unit at any time—during and/or after the occurrence that caused it. In this example, the reed switch is in the neutral zone when the Dome housing is mounted against a ferromagnetic back plate. Assume that the switch is normally in the off state and when the Dome housing is moved away from the back plate, the reed switch is turned on. When the Dome housing is restored to its position against the plate i.e. back in the neutral zone, the switch remains in the on state. These switches/sensors are also suitable as the primary or complementary sensor of door, window, etc., burglar alarms. Note that these examples are two of the many hysteresis based nonvolatile memory sensor applications that are all within the scope and spirit of the present invention.

Yet an additional feature of the present invention is the ability to reset the movement detector externally, for example, by the Premises Control Unit by providing sufficient current to a coil wrapped around the reed switch to restore the desired state. Note that in some configurations, the movement detector can be reset mechanically.

An additional feature of the present invention is the use of a plurality of reed switches in close proximity but exposed to induction of different polarities, for example, two switches associated with two magnets of opposite polarity. This array of switches and magnets makes restoring both switches to their off position by external magnetic tampering next to impossible.

Another advantage of the present invention is the integrity test of the movement sensor that is switched on and off remotely by means of driving the coil that is wrapped around the reed switch and, at the same time, verifying that the switch complies with the current drive commands generated by the Premise Control Unit.

Yet another advantage of the present invention is the integrity test of the proximity sensor itself to determine proper functionality through introduction of a magnetic induction field that turns the Dome sensor on and off independent of whether the Shell is proximate the Dome or not. Typically the test coil would be placed inside the Dome.

Another advantage of the present invention is the use of an additional Dome and Shell placed off-alignment (staggered) relative the original Dome and Shell to determine a door's movement (displacement information). This is useful, for example, in conjunction with nuisance alarm detection and prevention. It is accomplished most effective using semiconductor analog magnetic sensors.

Another feature of the present invention is the movement protected Shell housing in which the magnet structure moves to a position where its flux is routed within the Shell when a Shell housing removal is attempted. When the magnet structure is released to this position, the flux is no longer applied to the Dome, and an alarm is initiated from the Dome sensor. Moreover, the Shell cannot be restored to its functional mode once the magnet structure is repositioned as a result of movement due to attempted tamper unless special provisions are made in the magnet structure for that purpose. Note that the Shell housing is normally not wired to the Premises Control Unit requiring the alarm to be sent from the Dome that is wired. However, if the Shell housing is also wired for any reason the hysteresis sensor can be implemented for direct alarm transmission from the Sell housing.

Yet another feature of the present invention is remote line and switch impedance tracking, both while in the switch-on and switch-off positions, from the premises control unit to verify line integrity and detect proximity switch replacement. This tamper detection and switch exchange takes place during the tamper activity when power is on. But, more importantly, also when power is restored if power was out during the tampering attempt.

BRIEF DESCRIPTION OF THE DRAWINGS

The foregoing and other objects, features and advantages of the invention will be apparent from the following description of preferred embodiments, as illustrated in the accompanying drawings which are presented as a non-limiting example, in which reference characters refer to the same parts throughout the various views, and wherein:

FIGS. 32a through 32d illustrate implementation of a standalone hysteresis based proximity sensor.

DETAILED DESCRIPTION OF THE INVENTION

The particulars shown herein are by way of example and for purposes of illustrative discussion of embodiments of the present invention only, and are presented in the cause of providing what is believed to be the most useful and readily understood description of the principles and conceptual aspects of the present invention. In this regard, no attempt is made to show details of the present invention in more detail than is necessary for the fundamental understanding of the present invention, the description taken with the drawings making apparent to those skilled in the art how the present invention may be embodied in practice.

Figure 1:
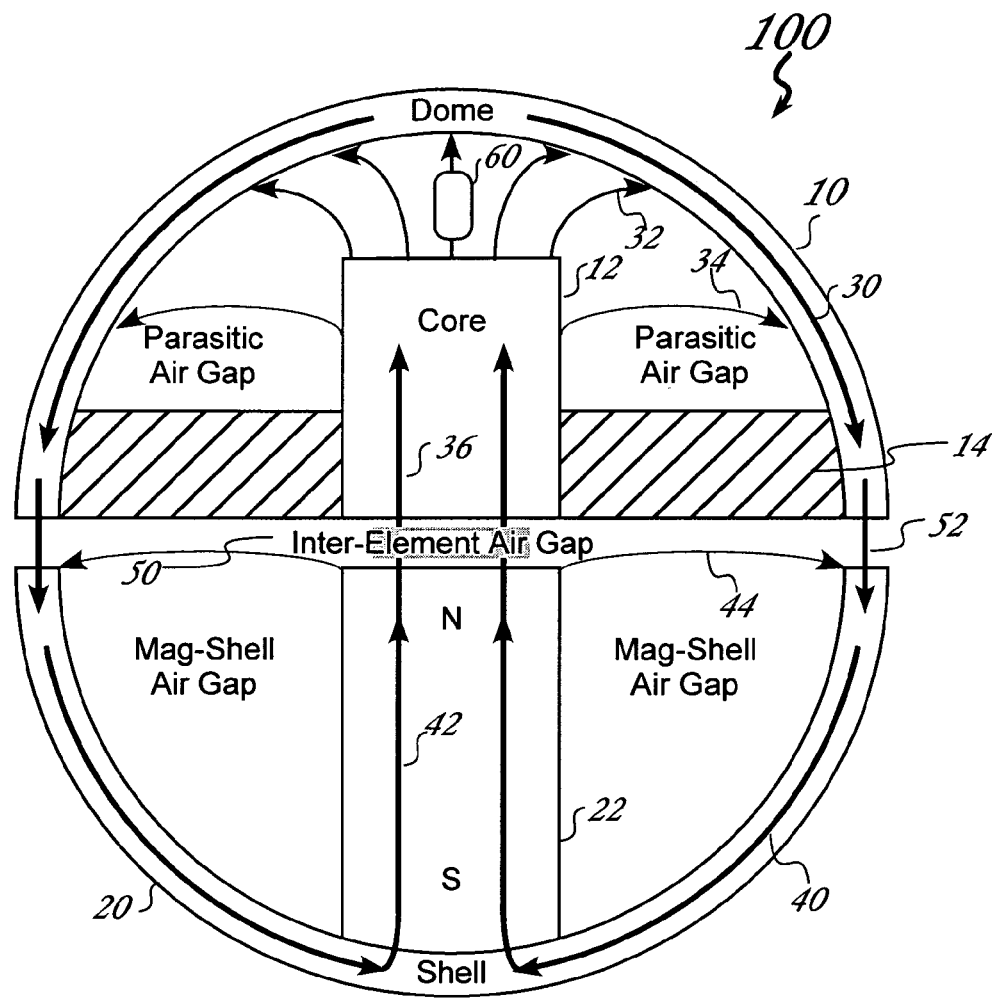
FIG. 1 shows embodiment 100 of a cross-section of an embodiment of a proximity sensor with the essential elements and their relative positions.

FIG. 1 illustrates the sensor assembly that is comprised of a stationary element the "Dome" 10 and a moving element the "Shell" 20 that are, for example, each enclosed in its own shield generally in a circular manner around their common vertical axis. Both the Dome 10 and the Shell 20 are comprised of high permeability (high μ–low reluctance) enclosures. These enclosures provide an internal environment impervious to magnetic field/flux.

The Shell 20 comprises a high permeability enclosure and a permanent magnet 22. The Shell can be substituted with a standard permanent magnet with concentric poles (not shown) or other magnetic array without departing from the scope and spirit of the present invention. The flux 40 in the enclosure 20 and a flux 42 in the permanent magnet 22 expose the magnetic flux in the direction of the Shell 20 illustrated upward and designated by the flux lines whose direction is designated by the arrows. A portion of the magnetic flux 44 does not leave the Shell 20 but loops back through the parasitic air gap. A larger parasitic air gap reduces parasitic flux 44 losses. The volume designated as parasitic air gap can be filled by non-ferromagnetic material for mechanical support of the magnet 22. The length of the permanent magnet 22 can be extended by high permeability core—not shown in FIG. 1.

The Dome 10 in FIG. 1 is comprised of a high permeability enclosure and high permeability core 12. The core 12 is optional and its length is adjusted in conjunction with the sensitivity of the magnetic flux sensor 60 for a desired sensitivity of the Dome 10 as it relates to the magnetic flux source of the Shell 20. The core 12 and the magnetic flux sensor 60 can be supported by a non-ferromagnetic material 14 leaving a sensor air gap between the core 12 and the Dome 10. The arrow marked flux lines 30, 32, 34, and 36 indicate the flux flow within the Dome 10. Flux lines 52 represent the flux flow in the inter-element air gap 50 between the Shell 20 and the Dome 10 when aligned and proximate each other.

The immunity to external magnetic fields of the proximity sensor improves with a stronger magnet 22 within the Shell. By narrowing the inter-element air gap 50, shortening the core 12 and lowering the flux at the sensor 60, the sensitivity of the overall proximity sensor is lowered and provides better tamper resistance. These properties and minimizing the size of the inter-element air gap 50 lowers the possibility of covert placement of an external magnet of sufficient strength between them that is able to compromise the integrity of the proximity sensor. The imperviousness increases as the permeability increases and as the thickness of the walls of the enclosures increase. Flux saturation of these enclosures will diminish the imperviousness to external magnetic flux. However, additional flux sensor(s), not shown, external to the Dome 10, can provide an additional measure to detect tamper attempts. These external flux sensors can offset, for example, the thickness of the Dome 10 or other measures of magnetic immunity.

Figure 2A:
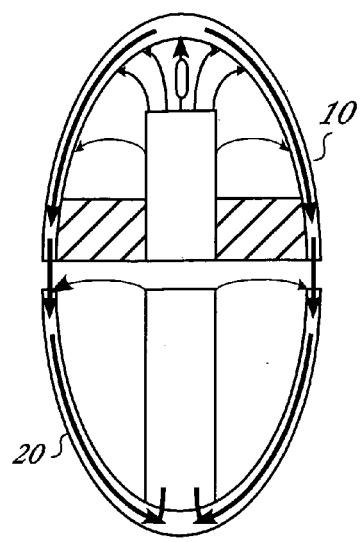
FIGS. 2a, 2b, 2c, and 2d show embodiment 100 in a variety of shapes derived from FIG. 1.
Figure 2B:
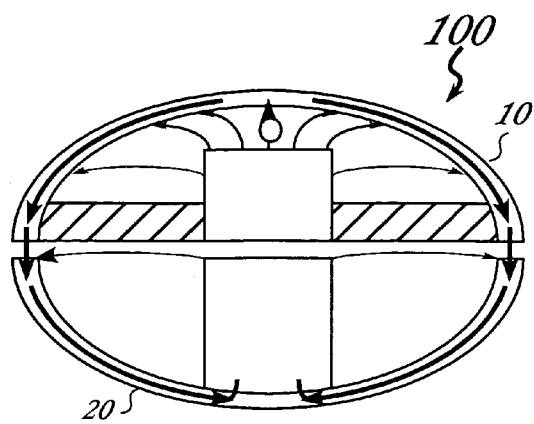
Figure 2C:
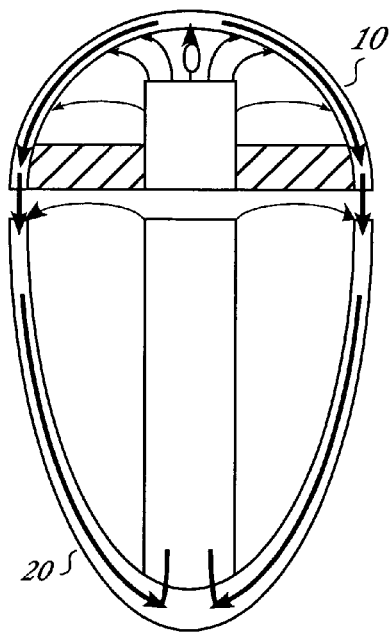
Figure 2D:
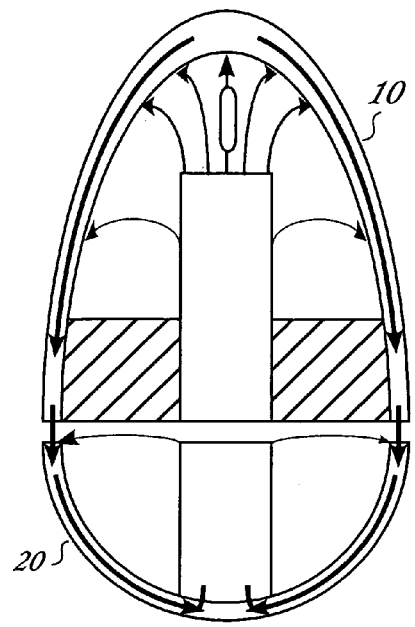
Figure 3:
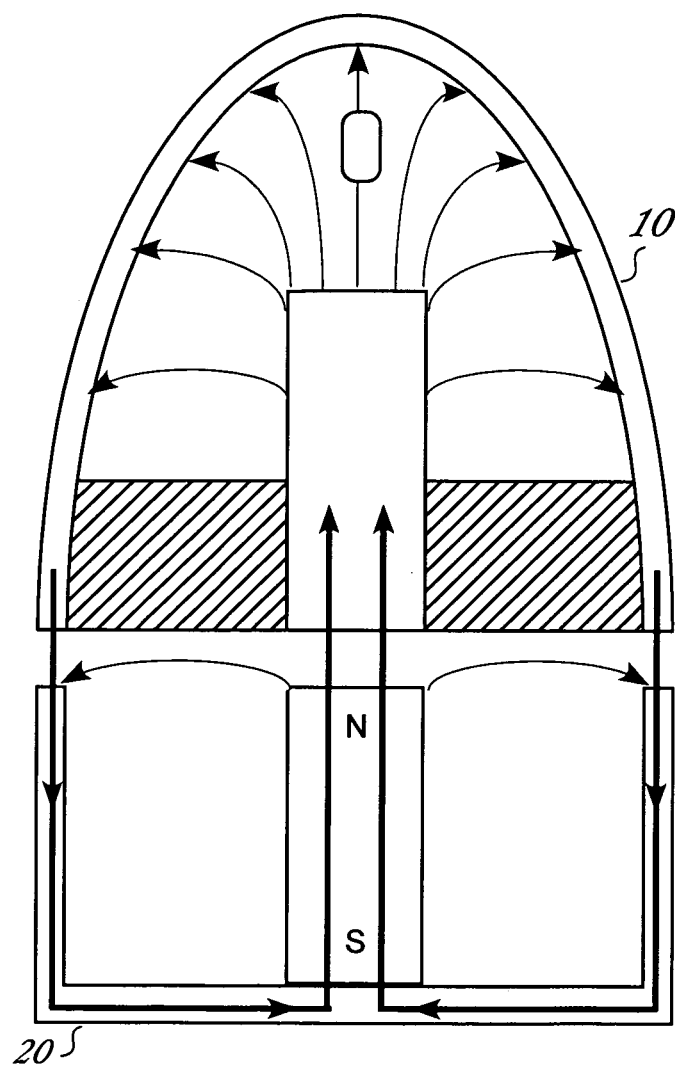
FIG. 3 shows yet another variation of FIG. 1.

FIGS. 2a, b, c, d and FIG. 3 illustrate the flexibility of specific shapes of the Dome 10 and the Shell 20 by a few random examples. The present invention is not limited to these specific shapes. The specific shape does influence the sensitivity of the proximity sensor by at least the virtue of parasitic flux relative to the sensor 60 air gap flux 32 ratio.

Figure 4:
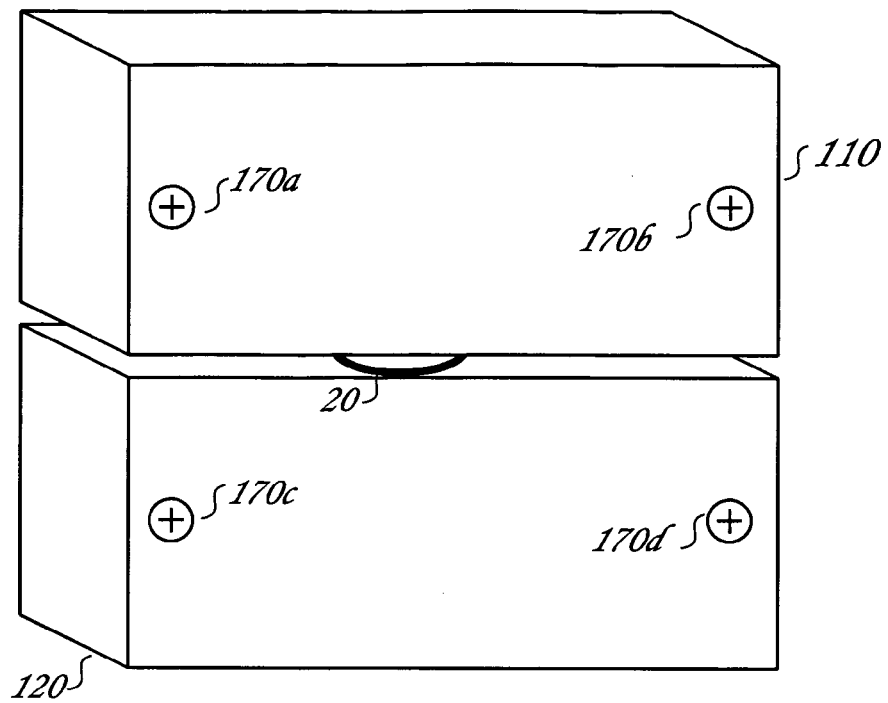
FIG. 4 shows an embodiment of both elements of the proximity sensor in their respective housing.

FIG. 4 illustrates the Dome 10 and the Shell 20 in their respective housing 110 and 120. A wide variety of housing material may be considered based on security and safety standards, however, magnetic permeability of the materials chosen may further increase the immunity to external magnetic fields. The Dome 10 and Shell 20 housings are shown, by way of example, to be mounted by screws 170a, b, c, and d. Other mounting methods are within the scope and spirit of the present invention.

Figure 5:
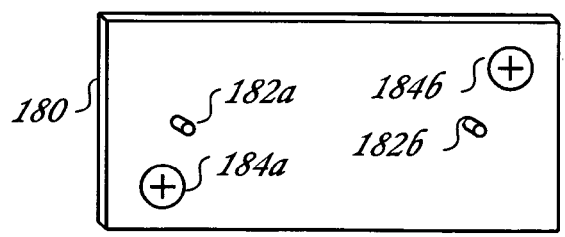
FIG. 5 shows an interlock bracket that is normally mounted under the Dome housing.

One way of circumventing the effectiveness of, for example, a security system using a magnetic proximity sensor is by removing both the stationary element and the mobile element (in this case housings 110 and 120 respectively) while maintaining their relative proximity and orientation positions. Such action does not result in, for example, the alarm of a security system. FIG. 5 illustrates an interlock bracket 180 with interlock pins 182a and b and mounting screws 184a and b. The bracket 180 is mounted under the Dome housing 110 setting an interlock contact with the housing 110. The bracket is mounted so that it cannot be reached before the Dome housing 110 is removed. The interlock pins 182a and b imply a mechanical interlock, however other interlock methods, such as, but not limited to, magnetic, capacitive, and optical are within the scope and spirit of the present invention. When the interlock is disengaged from the Dome housing 110, the Dome 10 sets a tamper attempt alarm.

Figure 6:
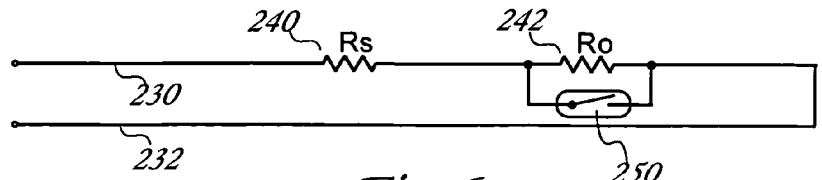
FIG. 6 shows a typical wiring of embodiment 100 of the proximity sensor when the magnetic sensor consists of a mechanical flux sensor such as the reed switch.

FIG. 6 illustrates an example of a mechanical magnetic flux sensor 250 such as, but not limited to, reed switch or Magnasphere® and their connectivity to a Premises Control Unit over two wires 230 and 232. The illustration also demonstrates the usage of finite value resistors $R_s$ 240 (open circuit) and Ro 242 (short circuit) for aiding in detection when the wires 230 and/or 232 are cut or shorted.

Figure 7:
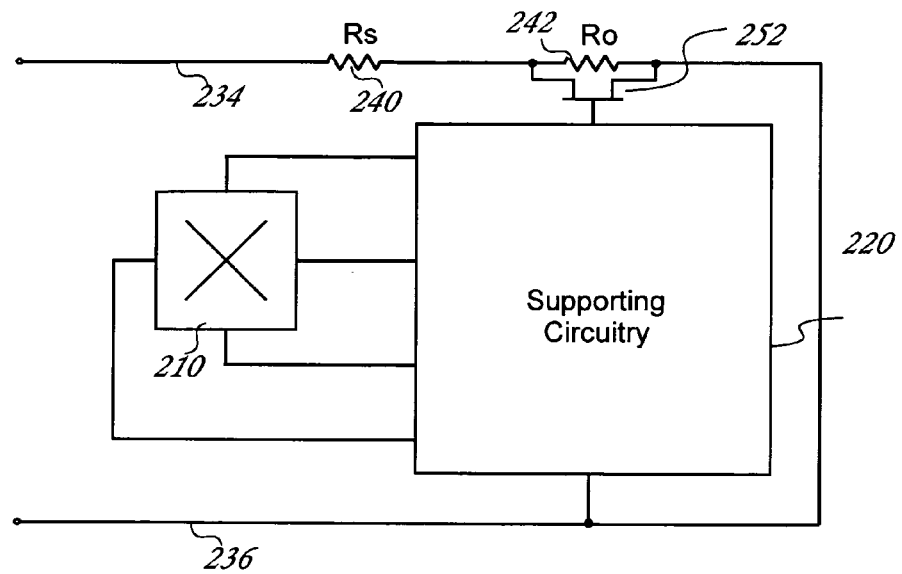
FIG. 7 shows embodiment 100 of the proximity sensor when the flux sensor consists of a Hall Effect sensor.

FIG. 7 illustrates a Hall Effect transducer 210 as part of active components of the proximity sensor. The sensor requires supporting circuitry 220 culminating in an electronic or electromechanical switch 252 represented in this case by an enhancement mode FET—other switching elements are within the scope and spirit of the present invention. This embodiment also includes the optional $R_s$ 240 and Ro 242 resistors and two leads 234 and 236 for connection to the Premises Control Unit.

Figure 8:
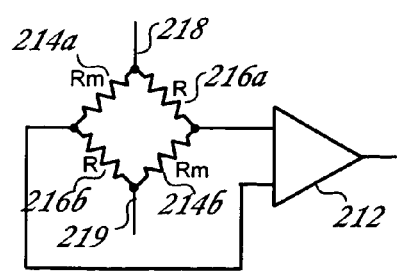
FIG. 8 shows a bridge example configuration of a magneto-resistive magnetic flux sensor.

FIG. 8 illustrates another active component magnetic flux sensor as part of the proximity sensor—in this case a magneto-resistive bridge configuration. The magneto-resistors 214a and 214b are two arms of the bridge and fixed resistors 216a and 216b are the other two arms of the bridge. Leads 218 and 219 provide the stimulus voltage to the bridge and the amplifier/comparator 212 provides the output for the supporting circuitry (not shown.) A bridge is just one example of magneto-resistive sensing. Other configurations are within the scope and spirit of the present invention.

Figure 9:
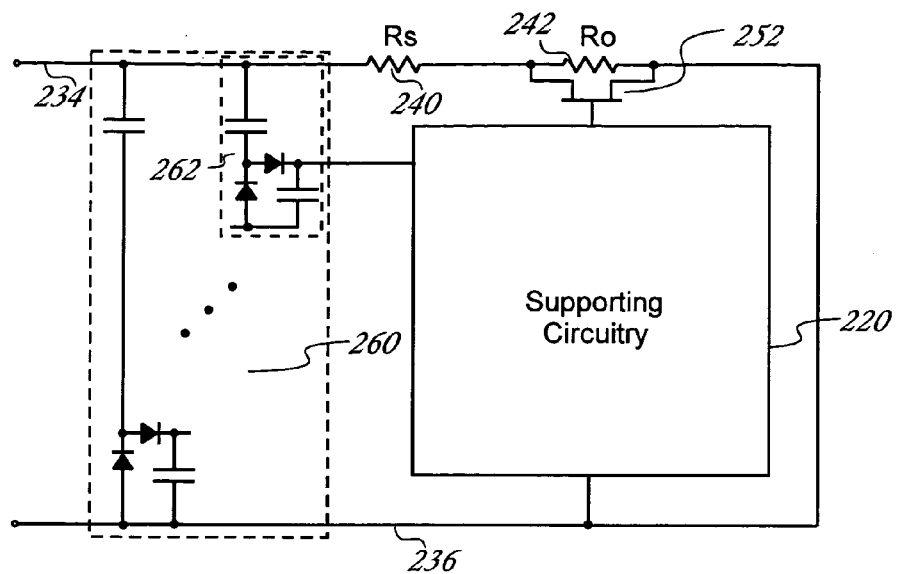
FIG. 9 shows the power delivery method to an active component proximity sensor such as a Hall Effect, magneto-resistive, etc.

The active components require power for proper function. This power can be delivered from a local battery, a local power outlet, directly by the premises control unit, etc. FIG. 9 illustrates an embodiment in which the power is provided by the Premises Control Unit over the same two lines 234 and 236 that convey the alarm. The power, in this example, is delivered in AC form while the alarm utilizes a DC component. Other power and alarm multiplexing such as, but not limited to, modulated AC and frequency multiplexing are equally within the scope and spirit of the present invention. Because the alarm switch 252 and the supporting circuitry may require operating voltage that is higher than that obtained from simple rectification, a voltage multiplier 260 is illustrated. The voltage multiplier 260 is based on, for example, voltage doublers circuit 262. Other voltage derivations do not depart from the scope and/or spirit of the instant invention.

Figure 10:
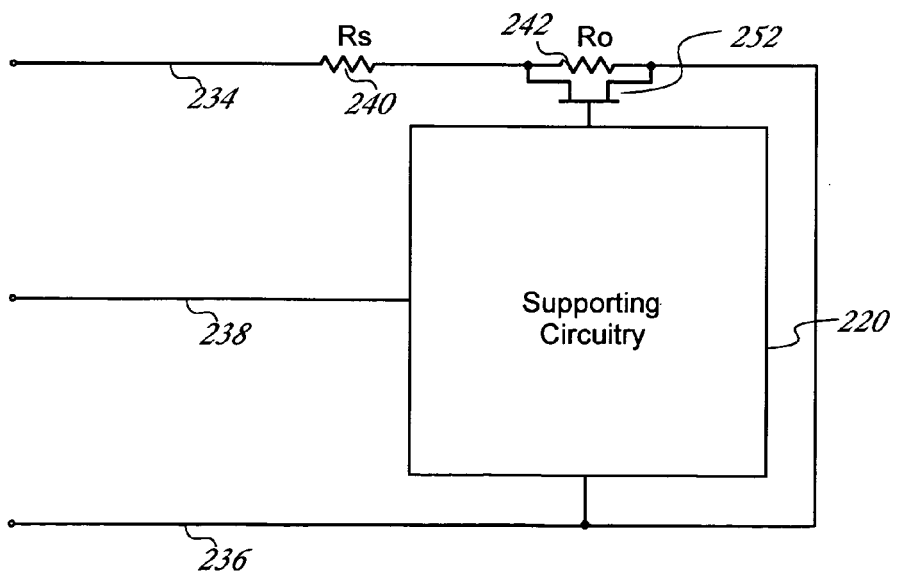
FIG. 10 shows a proximity sensor, connected with a third wire for data delivery.

FIG. 10 illustrates an embodiment in which a third lead 238 is dedicated to alarm conveyance and may be used for other communications with the Premises Control Unit. For example, active flux sensors are capable of delivering the presence of flux and flux intensity information. Such information may be used by the Premises Control Unit 300 for determining the integrity of the signal, tracking changes due to aging such as door sagging, etc., and using ever more encompassing algorithms.

Figure 11:
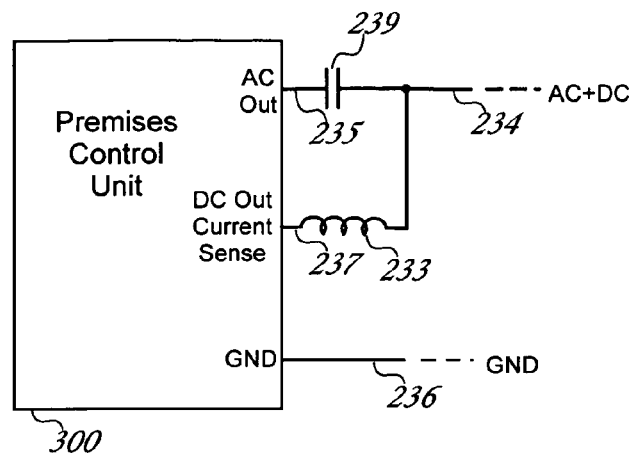
FIG. 11 shows the control panel connectivity to the proximity sensors.

FIG. 11 illustrates an example of proximity sensor's connectivity to the Premises Control Unit 300. The AC source of the Premises Control Unit 300 at point 235 is coupled to the lead 234 by a capacitor 239 and decoupled from the DC source and sense point 237 by inductor 233. Lead 234 carries both AC and DC that is routed back to the GND point on the Premises Control Unit 300 by lead 236. This is one demonstration of providing power to the proximity sensor for the active circuitry and at the same time sensing the status of the proximity sensor when both are multiplexed on a common connectivity.

Figure 12:
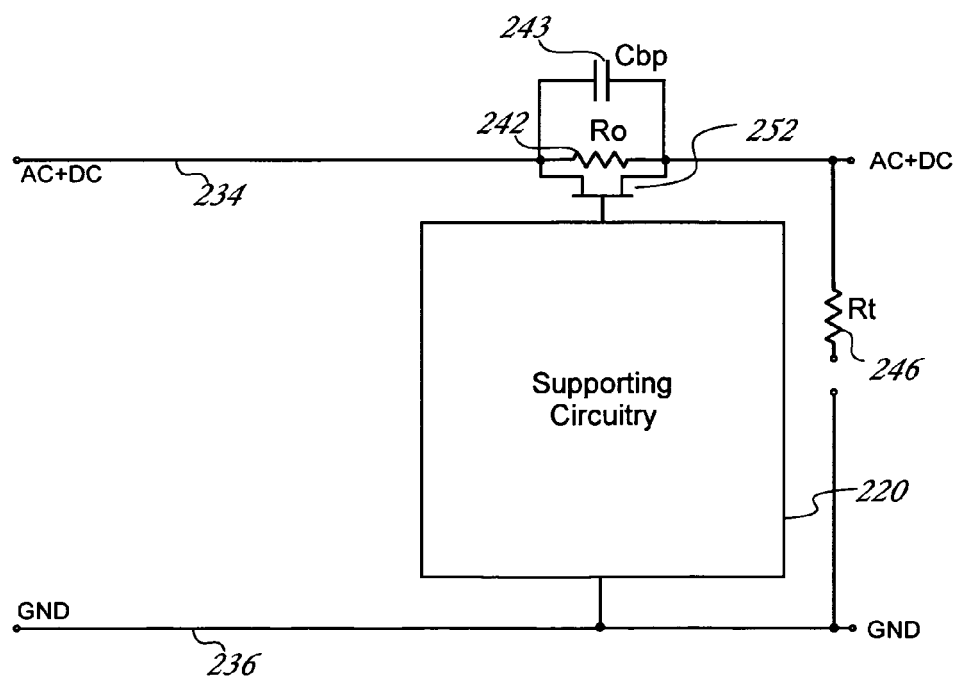
FIG. 12 shows an embodiment of a proximity sensor for daisy chain application of a plurality of sensors per zone.

FIG. 12 illustrates an example of a proximity sensor that can be concatenated to additional proximity sensors. This feature is used, for example, in security systems for a single zone protected by a plurality of proximity sensors. The connectivity is accomplished with one lead pair in a daisy chain manner (not shown). Note that the resistor Ro 242 is bypassed by an optional capacitor $C_{bp}$ 243 for the AC power to be able to flow to subsequent proximity sensors when switch 252 is open. More importantly, note that the resistor $R_s$ 240 of FIG. 10 is now substituted with a terminal resistor $R_t$ 246 that is connected to GND 236 on the last proximity sensor of the daisy chain only.

Figure 13:
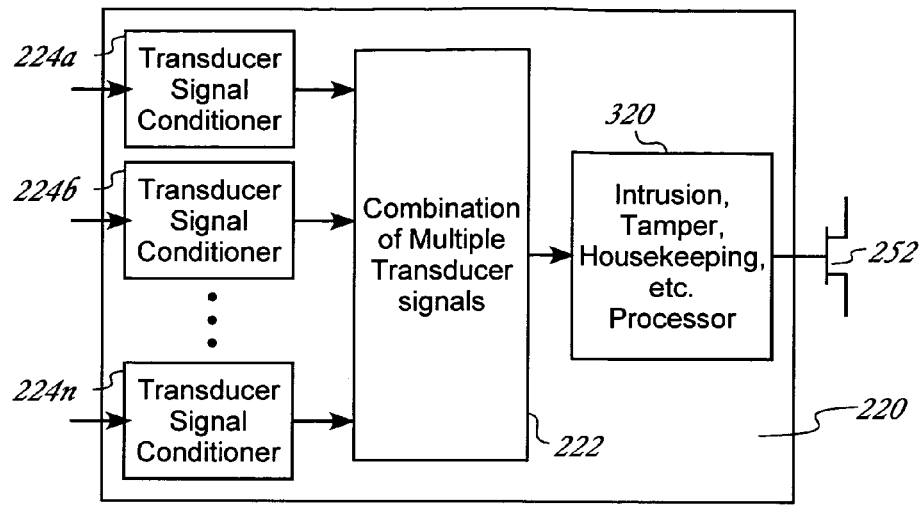
FIG. 13 shows an embodiment of parsed circuitry.
Figures 14, 15:
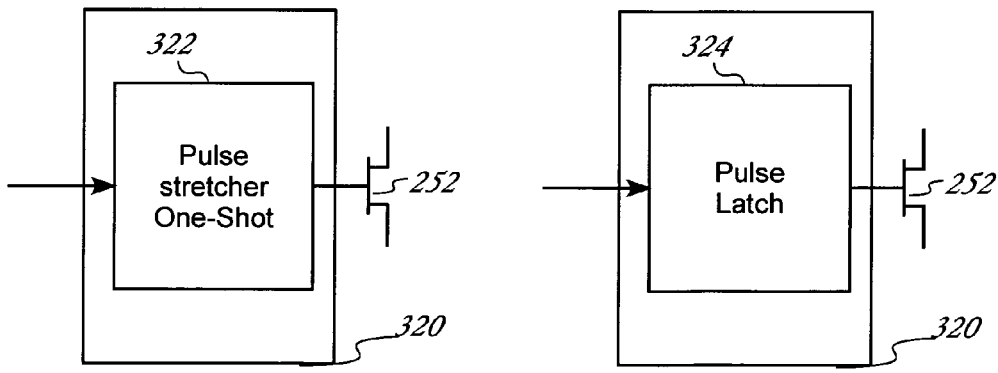
FIG. 14 shows an embodiment of a pulse stretch processor.
FIG. 15 shows an embodiment of a pulse latch processor.

FIG. 13 illustrates details of an embodiment of the support circuitry 220. A plurality of magnetic flux sensors may be desired where one sensor is inside the Dome 10 while others may be placed outside the Dome 10 for sensing of magnetic tamper attempts. All sensors are connected to their respective signal conditioners 224a, b, n. The conditioned signals are combined according to their respective functions in combiner 222. The combined signal is sent to processor 320 to act upon. The switch 252 is activated to an alarm status when so determined by the processor 320. The processor 320 may be tasked to stretch the signal, as shown in FIG. 14, by stretcher 322 so that an alarm can be registered at the Premises Control Unit 300 no mater how brief the disruption of the proximity sensor. FIG. 15 illustrates a latching alarm scheme by latch 324 that will hold in alarm mode until reset. The reset may be implemented locally or remotely.

Figure 16:
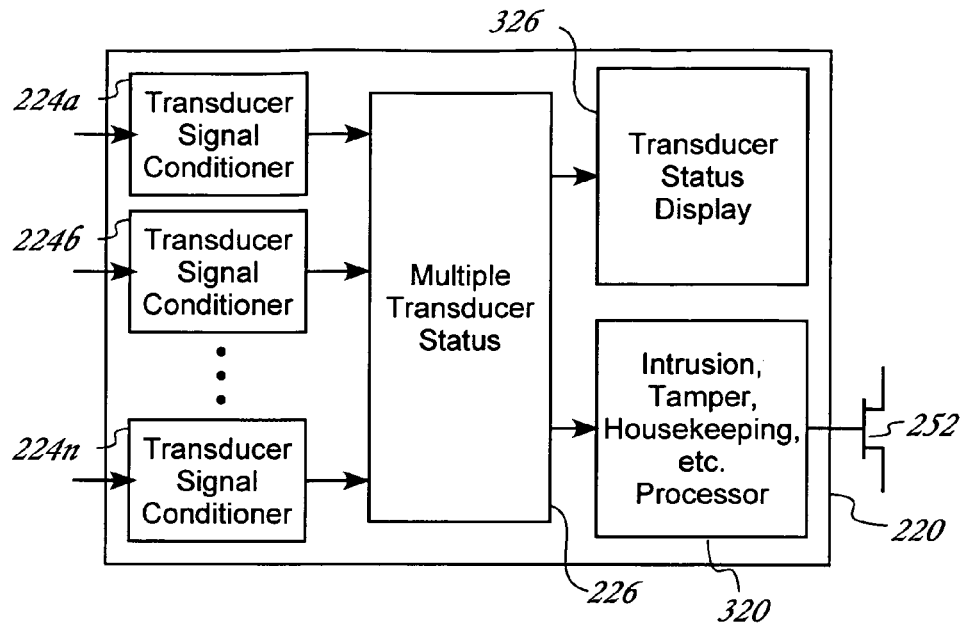
FIG. 16 shows an embodiment of a circuitry with status display.

FIG. 16 illustrates an embodiment of supporting circuitry 220 where the multiple transducer status 226 coveys the information to a local in situ status display 326 in addition to the processor 320.

Figure 17:
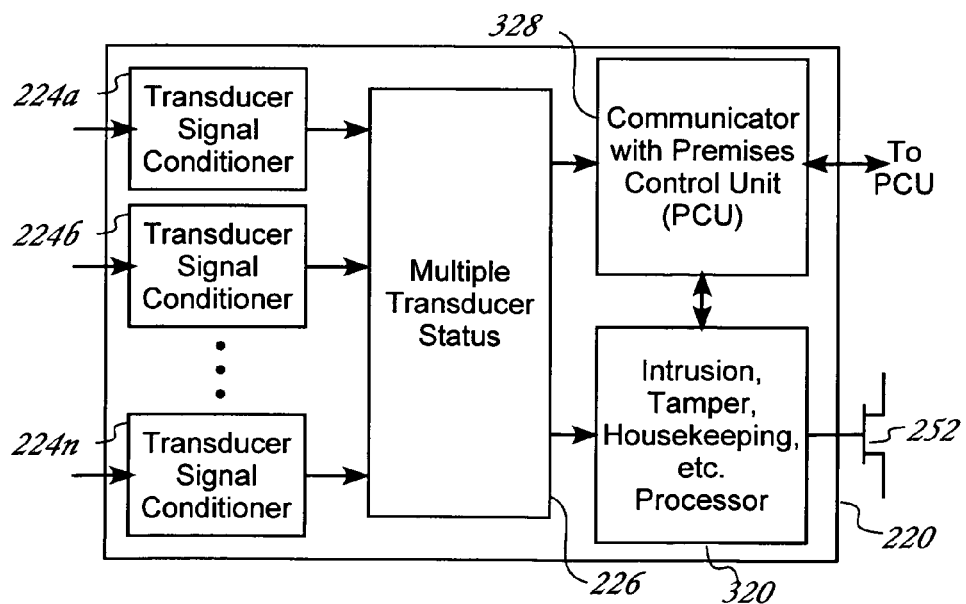
FIG. 17 shows an embodiment of a circuitry with communication with the premises control unit.

FIG. 17 illustrates the addition of a communicator 328 which communicates with the Premises Control Unit (PCU) 300. The communicator 328 receives its information from the multiple transducer status 226 and communicates back and forth with the processor 320. The communication with the PCU can be over a dedicated lead 238, wireless (not shown), or multiplexed on the two lead 234 and 236 connectivity along with power and DC alarm. The two way communication between the proximity sensor and the PCU offers many possibilities for interactive alarm system integrity testing transducer calibration, sensitivity to fine variations of transducer security sensing, programming of the proximity sensor with desired parameters, such as, but not limited to, hysteresis thresholds, etc.

Several of the drawings emphasize specific features for clarity of purpose. However, combination of plurality of these features in a single proximity sensor is within the scope and/or spirit of the instant invention. Alarm can be initiated by any change of the magnetic flux internal to the Dome 10, around the Dome 10, and outside the Dome 10 within predetermined tolerances. Periodic calibration and monitoring of long term flux changes within the magnetic sensor 60 air gap 32 inside the Dome 10 can compensate for slow spatial drift of the two sensor components due to, for example, door sagging brought on by temperature and/or aging. The same compensation applies to other aging and temperature effects on the sensitivity of the Dome 10 or Shell 12.

In addition to external magnet tamperproof proximity sensing that is executed by a high security magnetic proximity switch, another important feature is that when there is movement of the proximity sensor (Dome housing 110) from its mounted position, the event is registered at the Premises Control Unit 300. This tamper attempt registration is necessary either at the moment of movement, if the electrical protection is turned on, or at the moment the electrical protection is turned on, if movement occurs while the protection is turned off. Since it is necessary to detect movement of the mounted Dome housing 110 even when the movement occurred when supervisory power was off, a memory element is necessary that does not depend on supervisory power. This type of nonvolatile memory must retain its state of tamper attempt alarm until the supervisory power is restored and actual tamper alarm is detected at the Premises Control Unit 300 while denying the tamperer the possibility of changing the memory state in situ. This tamperproof nonvolatile memory can be based on mechanical or magnetic phenomena that can latch the tamper attempt state in the absence of electrical power.

Figure 18A:
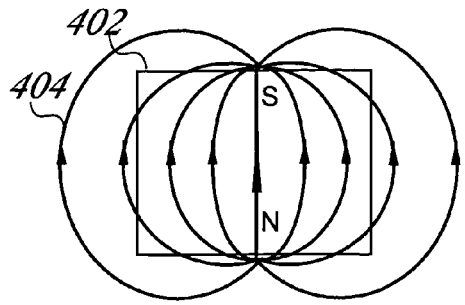
FIGS. 18a, b. c, and d illustrate the intra-magnetic flux flow of a single magnet with and without a ferromagnetic plate.
Figure 18B:
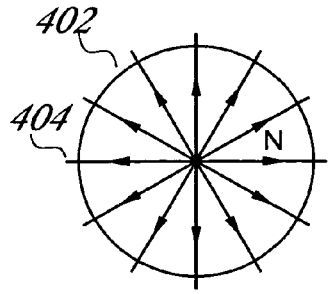
Figure 18C:
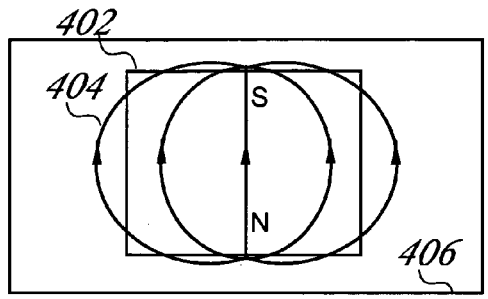
Figure 18D:
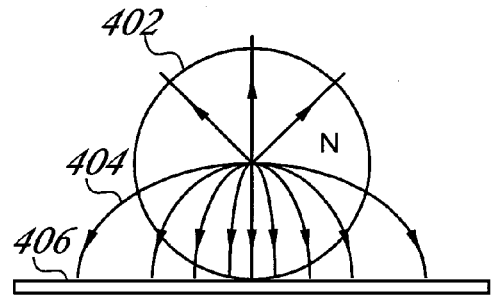

FIGS. 18*a*, *b*, *c*, and *d* illustrate magnetic properties that lead to a nonvolatile memory. The side and bottom views of the magnet 402 (FIGS. 18*a* and *b* respectively) illustrate evenly distributed induction or flux density lines 404. FIGS. 18*c* and *d* illustrate the same magnet views in the presence of a ferromagnetic plate 406 proximate the magnet resulting in flux density concentration toward the plate 406 as portrayed by the flux lines 404. This shift in flux density also reduces flux density toward the opposite side of the magnet 402 portrayed by scarce flux lines 404.

Figure 19:
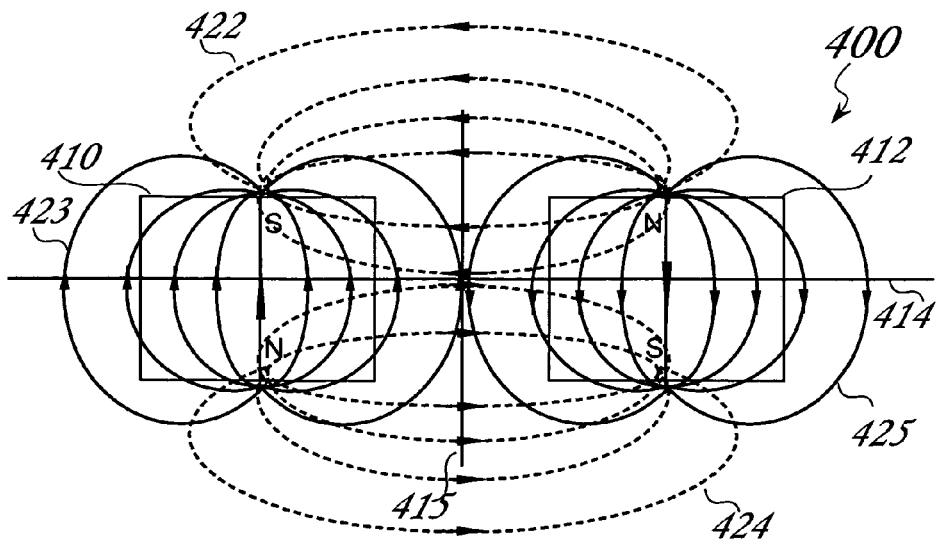
FIG. 19 illustrates the intra-magnetic and the inter-magnetic flux flow of two magnets—Side view.

FIG. 19 illustrates embodiment 400 of two magnets 410 and 412 in relative proximity and oriented in opposite polarity to each other. Note that there are two sets of flux lines: the inter-magnet flux lines 422 and 424 and the intra-magnet flux lines 423 and 425. The two sets are generally orthogonal. Therefore, for the sake of clarity, the following descriptions will concentrate on the 423 and 425 set only. However, the set of 422 and 424 is equally suitable for arguments presented for the 423 and 425 set and their use is within the scope and the spirit of the present invention. Note that the flux line set 423 and 425 cancel each other at the vertical plane 415 while the flux set 422 and 424 cancel each other on a horizontal plane (equatorial) 414.

Figure 20:
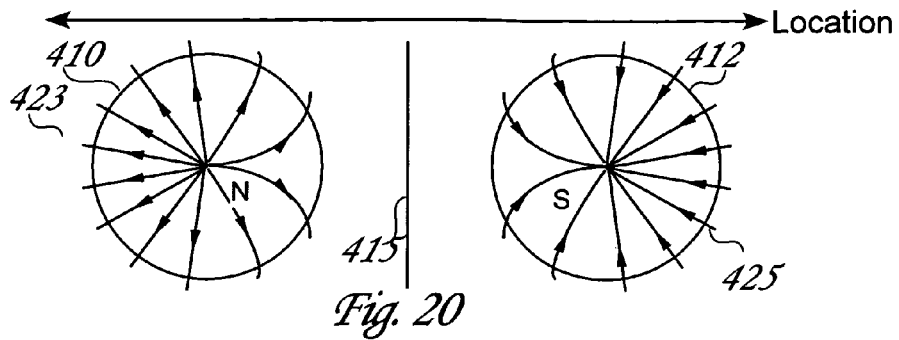
FIG. 20 illustrates intra-magnetic flux flow of two magnets—bottom view.
Figure 21:
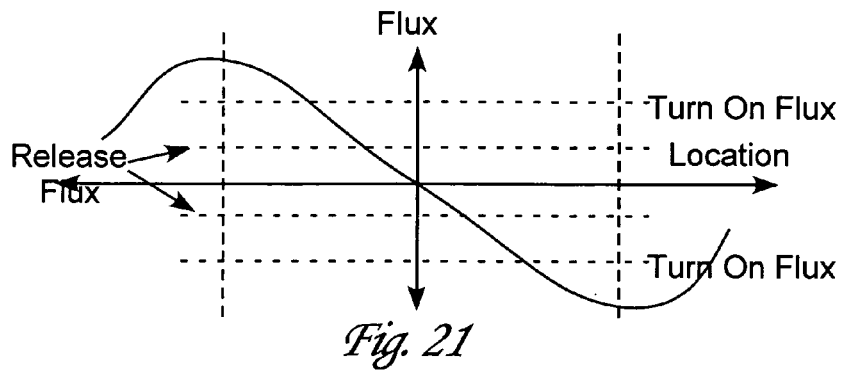
FIG. 21 illustrates the graphical flux level representation of two magnets.

FIG. 20 illustrates the effective flux lines 423 and 425 of magnets 410 and 420 respectively—bottom view. Also illustrated are the flux neutral vertical plane 415 and a horizontal line designated "Location". FIG. 21 is a graphic approximate representation of the flux density level as a function of the horizontal axis "Location". The graph also illustrates the "Turn On" and Turn Off" flux levels for a typical reed switch when placed parallel to the magnet axis along the line designated "Location" in FIG. 20. These "Turn On" and Turn Off" flux levels demonstrate the hysteresis feature of the reed switch. Note that other magnetic sensors both mechanical and electrical also display hysteresis and are within the scope and spirit of the present invention.

Figure 22:
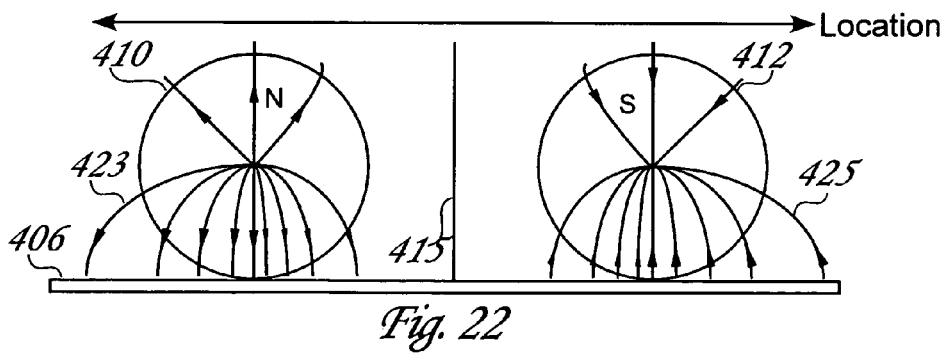
FIGS. 22 and 23 illustrate equivalent features to FIGS. 20 and 21 respectively while a ferromagnetic plate is proximate the magnets.
Figure 23:
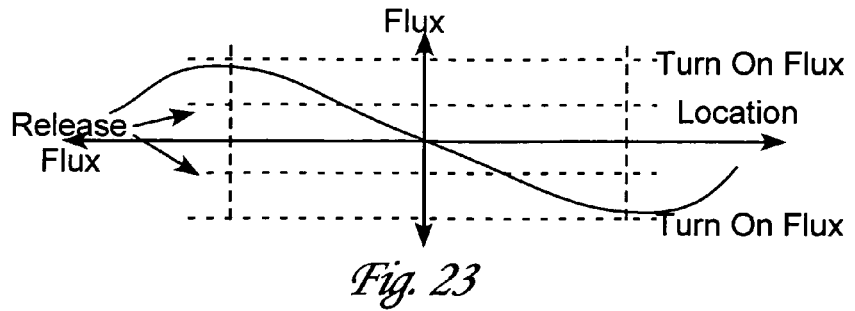

FIGS. 22 and 23 differ from FIGS. 20 and 21 by the introduction of the ferromagnetic plate 406. Note the resulting change in flux density (FIG. 22) and the reduced flux density along the horizontal line "Location" (FIG. 23).

Figure 24:
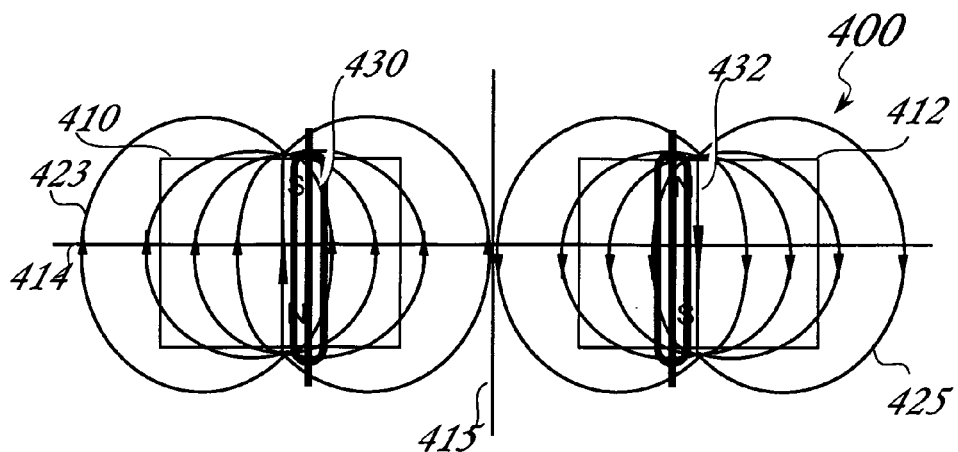
FIG. 24 illustrates placement of the reed switches relative the magnets—side view.
Figure 25A:
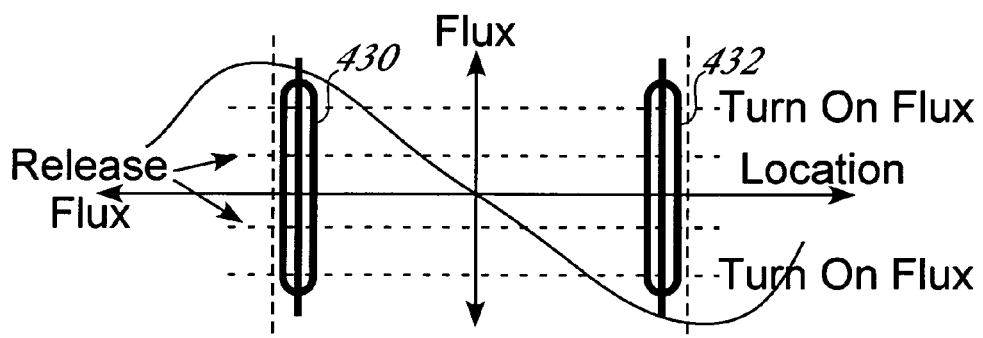
FIGS. 25a and b illustrate graphic representation of the flux level intensity and the relative placement of the reed switches without and with the ferromagnetic plate respectively.
Figure 25B:
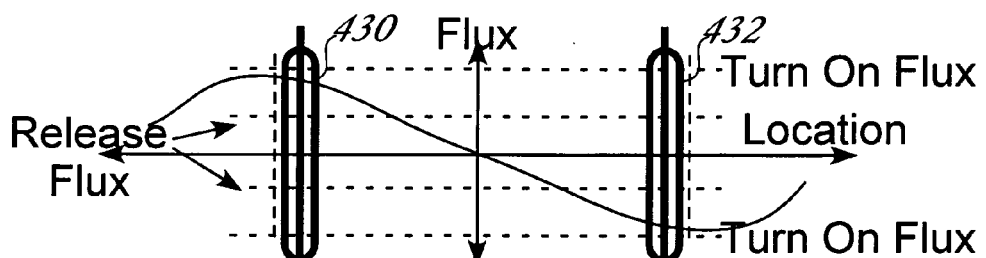

FIG. 24 illustrates the placement of the magnetic sensors, such as, but not limited to, reed switches 430 and 432 relative the magnets 410 and 412. FIGS. 25*a* and 25*b* further demonstrate the exposure of reed switches 430 and 432 to flux level without and with a ferromagnetic plate 406 of FIG. 22 respectively. Note that in the case where the ferromagnetic plate 406 is absent (FIG. 25*a*) the reed switches 430 and 432 are each exposed to opposite flux polarity but both exceed the turn-on flux density level. Consequently, both reed switches 430 and 432 are in the "on" position. However, in the case where the ferromagnetic plate 406 is present (FIG. 25*b*), the reed switches 430 and 432 are each exposed to opposite flux polarity but both are located between the turn-off and turn-on flux density level (the neutral zone). Consequently, both reed switches 430 and 432 are in the "on" or "off" position depending on their position before entering the neutral zone between the "turn-on" and "turn-off" threshold levels.

Figure 26A:
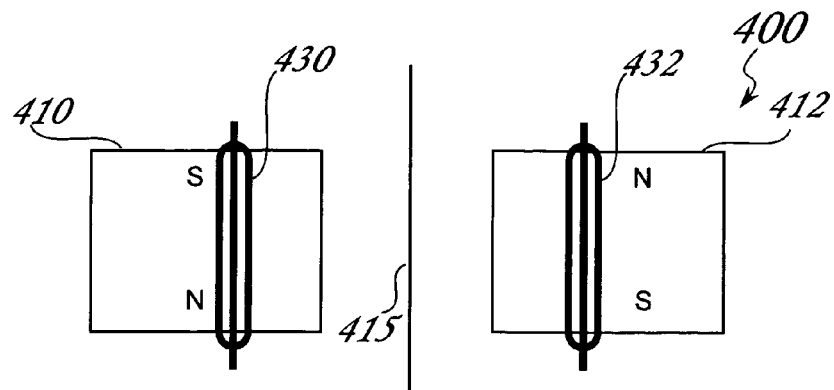
FIGS. 26a, b, c, and d illustrate placement of the reed switches relative the two magnets, their optional shapes, and relative the ferromagnetic plate.
Figure 26B:
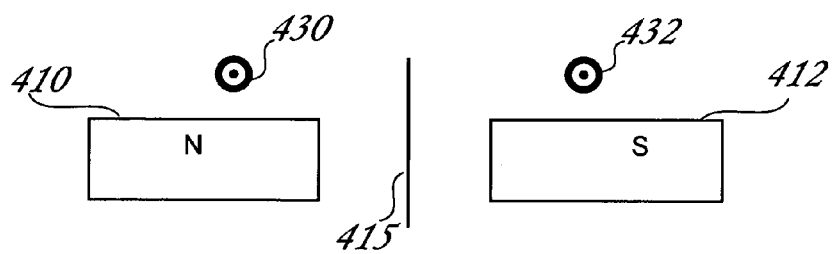
Figure 26C:
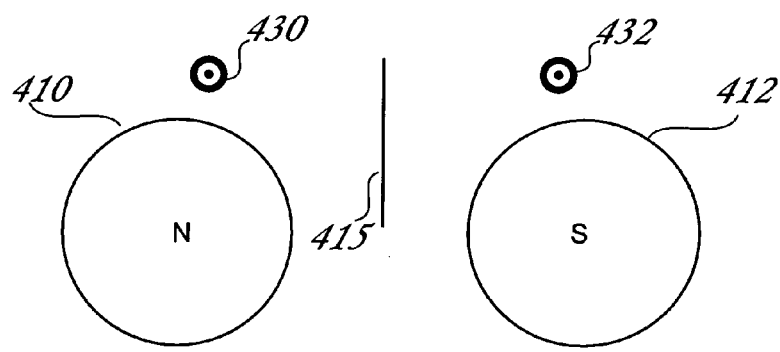

FIGS. 26*a* through 26*d* emphasize the bottom view of the placement of the reed switches 430 and 432 relative the magnets 410 and 412 and relative the ferromagnetic plate 406. Note that the shape of the magnets can vary. For example, FIG. 26*b* shows a rectangular cross-section.

Assuming the ferromagnetic plate 406 is present and that both reed switches 430 and 432 are in the "off" position, they will remain in the "off" position. When the ferromagnetic plate is removed, both reed switches 430 and 432 will turn "on" because the flux density exceeds the "turn-on" threshold level and it will remain in the "on" position even when the ferromagnetic plate 406 is replaced—reducing the flux density to the neutral zone. This could be equally accomplished with a single magnet and a single reed switch; however, the reed switch could be turned off again by an external magnetic manipulation. Having the two magnet configuration with opposite polarity and close proximity makes it extremely difficult to manipulate the reed switches 430 and 432 into the "off" position by external magnets. Other patterns and orientations using two or more magnets and sensors for this purpose are within the scope and spirit of the present invention. Note that the discussion implies type A contacts while other contact configurations are equally within the scope and spirit of the present invention. However, polarity and connectivity must be adjusted for logical consistency.

These hysteresis based switches/sensors retain their state once triggered even after the cause of the trigger is removed. They are also suitable for use as independent main alarm switches for detecting intrusion and/or tamper attempts while used alone or in conjunction with other sensors.

Figure 27:
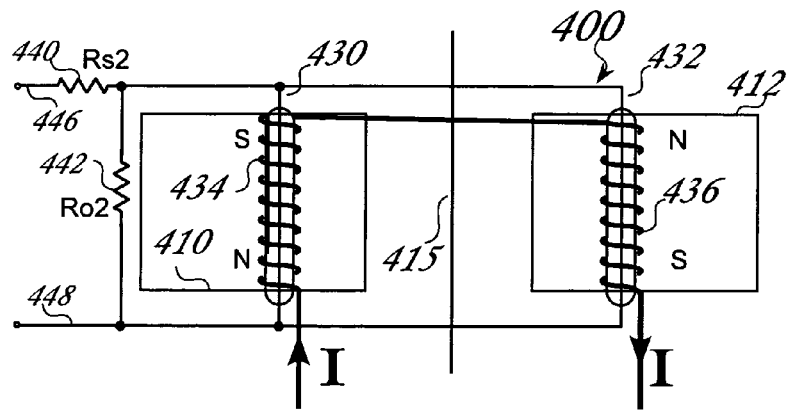
FIG. 27 illustrates alarm reset and text coils around the reed switches and their interconnection options.

FIG. 27 illustrates a means to bring the reed switches back into the "off" position (reset) electrically using coils 434 and 436. In this example, both coils are driven in series and are connected for opposite polarity. The coils may also be driven independently. For changing the position of switches 430 and 432 from "on" to "off" or from "off" to "on", the coils 434 and 436 must be driven with sufficient current so that the aggregate flux density is brought below the "turn-off" level and above the "turn-on" level respectively. These coils 434 and 436 can also be used to test the integrity of the reed switches 430 and 432 by turning them on and off periodically. The coils 434 and 436 should not be accessible in situ; instead they must be driven by and controlled from the Premises Control Unit 300. The reed switches 430 and 432 are shown wired in parallel in FIG. 27 stipulating an A type contact at each reed switch. However, they may be sensed independently and utilize additional coils and other contact forms as desired without departing from the scope and spirit of the present invention. In some configurations where the switches 430 and 432 are accessible, resetting can be accomplished mechanically by either momentary increase of the distance between the switches 430 and 432 and the magnets 410 and 412 or by presenting a ferromagnetic substance beaten them, etc.

FIG. 27 also illustrates a serial resistor 440 and a parallel resistor 442 as related to the contacts of the reed switches 430 and 432. These or other protection, diagnostics and termination resistors may be implemented relative any contacts of the present invention without departing from the scope and the spirit of the present invention.

These termination resistors (serial resistor 440 and a parallel resistor 442) and other optional components (not shown), contribute to the impedance value as seen from the premises control unit. This impedance is distinct for each switch, both in the on and the off states, as it is related to resistor tolerances. The total tracked impedance also includes the impedance component of the line connecting the switch to the premises control unit. Tracking total impedance for changes determines whether the wiring has been tampered with or the proximity switch module has been replaced, etc. Threshold of impedance variations as a function of temperature and other environmental effects should be considered as allowable. Optional environmental sensors are used for predicting impedance changes for tighter tolerance thresholds. Moreover, environmental sensors, such as, but not limited to, temperature, pressure, and humidity can be indicators of acceptable structural changes of the door, window, etc.

The ferromagnetic plate 406 is mounted similarly to and in place of the interlock plate 180 of FIG. 5 and the magnets 410 and 412 with the reed switches 430 and 432 in the Dome housing 110 of FIG. 4. Any attempt to remove the Dome housing 110 from the ferromagnetic plate 406 will be latched by the reed switches which will stay in their latched position when the Dome housing 110 is replaced into its original mounted position. The only way to restore the reed switches 430 and 432 is from the Premises Control Unit 300. However, this will not occur before power is restored and the tamper attempt is registered.

A coil, not shown, placed inside the Dome 10 proximate the sensor 60, wrapped around the core 12 or equivalent can be used for activating and deactivating the sensor 60 remotely, for example, from the Premises Control Unit 300 for the purpose of testing the integrity of sensor 60. This test can be performed either when the Shell 20 is proximate the Dome 10 (i.e. door is closed) or when the Shell 20 is not proximate the Dome 10 (i.e. door is open). The difference between the two conditions determines the amount and/or the direction of the current within the coil.

Note that Premises Control Unit 300 in the present invention is used as a generic term that designates a variety of functional attributes. That is not to be interpreted as a single unit in one particular location. Instead, it refers to functions performed remotely to the Dome 10 and may be distributed in a plurality of locations.

Figure 28A:
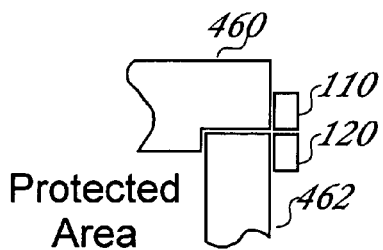
FIGS. 28a and b illustrate sensor mountings when a door swings open inward into the protected area and outward from the protected area respectively.
Figure 28B:
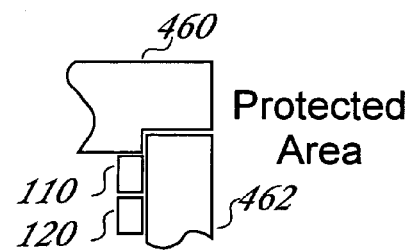

Typically the proximity sensor in mounted on the inside of the protected area, however the doors or windows are designed to swing open inward into the protected area (FIG. 28*a*) or outward (FIG. 28*b*). Note that that Dome housing 110 is mounted a vertical plane on the door frame 460 with fasteners (not shown) driven horizontally and the movement protection ferromagnetic plate (not shown) is between them. The protective switches and magnets of FIG. 27 face the door frame 460. FIG. 28*b* illustrates the Dome housing 110 mounted on a horizontal plane of the door frame 460 with the ferromagnetic plate (not shown) between them. Therefore, in this model, the protective switches and magnets of FIG. 27 face the door frame 460 i.e. at the top of the Dome housing 110. This protection can be dispensed with in this model because the Dome housing 110 mounting screws are not accessible for removal while the door is closed and the Shell housing 120 is in place. This configuration is vulnerable to removal of the Shell housing 120 from the door and then opening the door while leaving the Shell housing proximate the Dome housing 110.

Figure 29A:
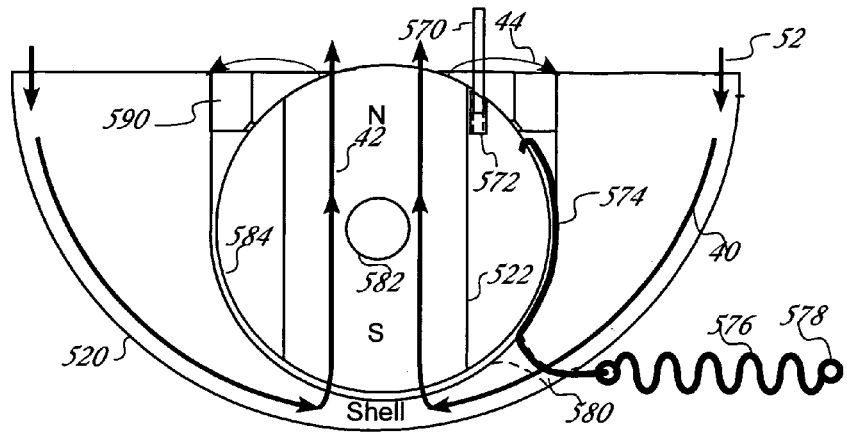
FIGS. 29a, b, and c illustrate a Shell and Shell housing showing the detection mechanism when a movement attempt is made.
Figure 29B:
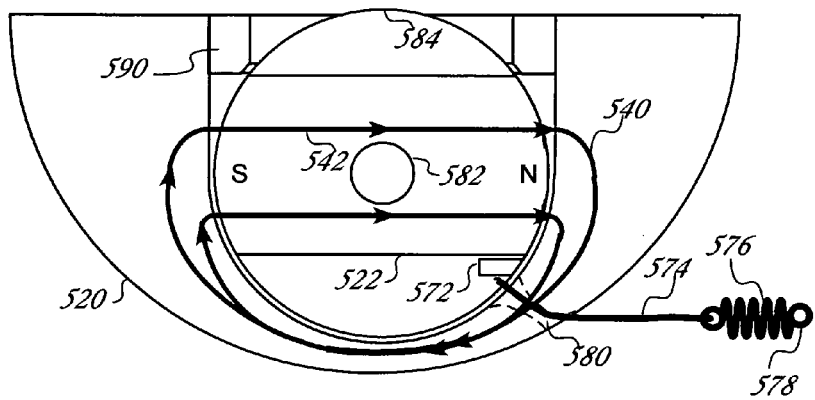

FIG. 29*a* illustrates an embodiment of a Shell 520 with a movement protection mechanism. The magnet 522 is oriented in the same manner as the magnet 22 in Shell 20 of FIG. 1. However, magnet 533 is part of a non-ferromagnetic material structure 584, for example in the form of a ball, that pivots around a horizontal axis 582 when an attempt to remove the Shell housing 120 is in progress by loosening the fastening screws 588 (shown protruding from the fastening holes in FIG. 29*c*. Once the magnet 522 pivots into a mostly horizontal position (see FIG. 29*b*), the flux 542 circulates through the Shell in a manner that keeps the magnet structure 584 in place.

Figure 29C:
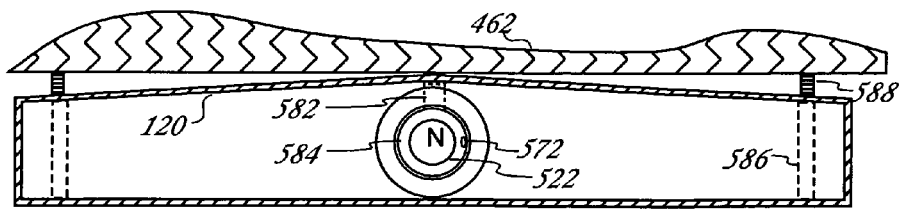

In the example shown in FIG. 29*a*, a cord 574 is attached to the magnet structure 584 at one end, and is threaded through the slot 580 of the Shell 520, while the other end is attached to the tension spring 576. The far end of the spring 578 is anchored within the Shell housing 120 (not shown). A stop pin 570 is lodged in the designated hole 572 to prevent the structure 584 from turning before installation is complete. FIG. 29*c* shows how the top view of the Sell housing 120 and its back, facing the door, 462 has a slight hump and does not line up with the door surface. However, that back has some elasticity so that when tightly pressed against the door during installation by the fasteners 588, it becomes compressed and lines up with the door 462 and, at the same time, immobilizes the magnet structure 584 while pressing on the axis 582 of the structure 584. Consequently, stop pin 570 can be removed when installation is completed. During an attempt to remove the Shell housing from its position on the door by loosening the fasteners 588, the grip on structure 584 will lessen and allow spring 576 to rotate the magnet structure 584. Once rotation starts, it is aided by the magnetic forces within the Shell 520 to bring it close to the horizontal position show in FIG. 29*b*. In the horizontal position, no flux is emitted toward the Dome 10 causing a state of alarm.

FIGS. 29 *a*, *b*, and *c* illustrate an example of collapsing vertical flux emanations when an attempt to remove the Shell housing 120 is made. However, other methods and devices for collapsed flux at the Dome 10 are within the scope and spirit of the present invention. Note that the Shell housing 120 protection against removal is important particularly when the door swings open away from the protected area and that it also can be used when the door swings inward or in case of sliding door. Also note that although the discussion in the present invention focused on doors, other portals, etc., such as windows, are within the scope and spirit of the present invention.

For clarity, FIGS. 29*a* and *b* illustrate a linear tension spring 576 and a cord 574 for initiating the rotation of the magnet structure 584. However, a rotary axial (axis 582 for example) spring, gravity, or other means of rotating the magnet structure 584 is within the scope and spirit of the present invention. These figures also illustrate an optional flange 590 for retaining the magnet structure 584 in place. The flange 590 is preferably made of non-ferromagnetic material so as to prevent excess Shell parasitic flux 44 at the expense of the flux emitted to the Dome 10.

Figure 30A:
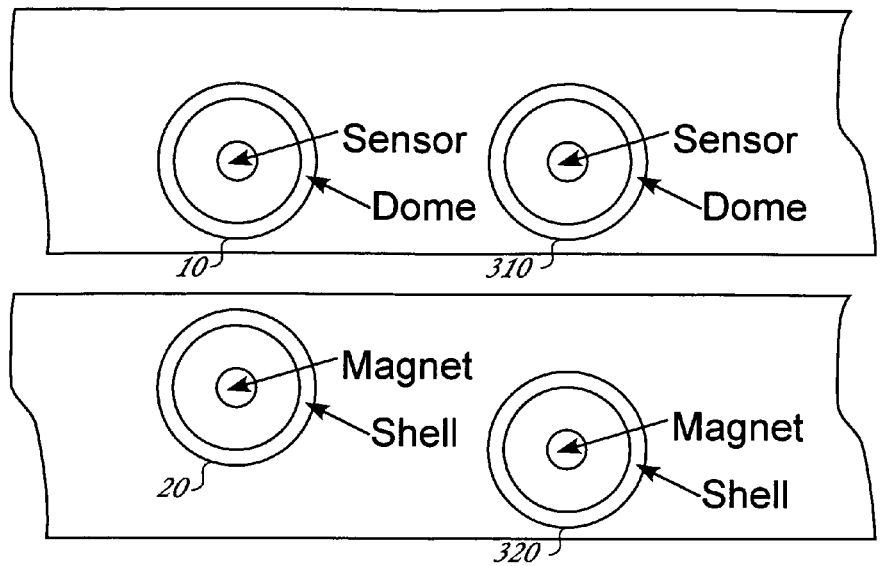
FIGS. 30a and 30b, illustrate the staggered alignment of shells and domes of the proximity sensor.
Figure 30B:
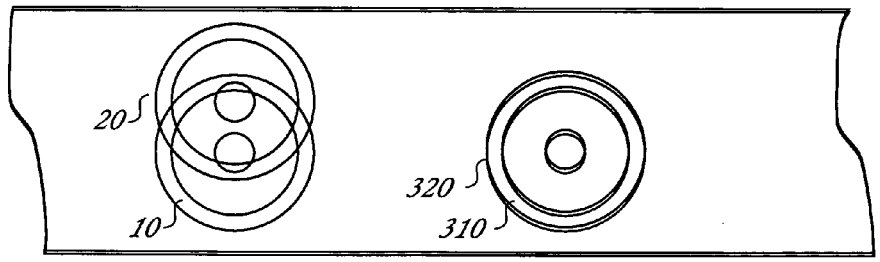
Figure 30C:
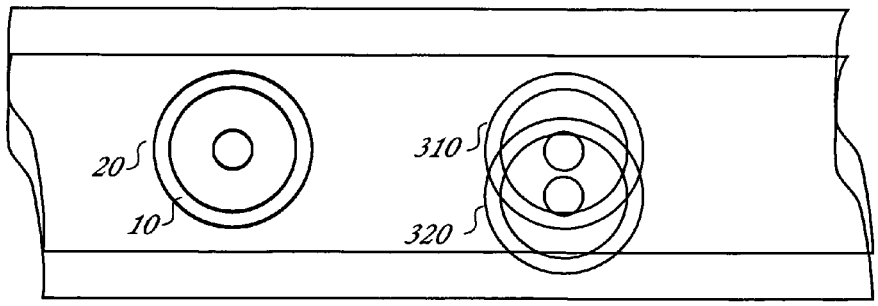

FIG. 30*a* shows the location of the aligned Domes 10 and 310 of a switch assembly (top) and staggered Shells 20 and 320 of a magnet assembly (bottom.) This example shows two Domes and two Shells where the Shells are staggered. However, any number of Domes and Shells and any mutual displacement from perfect lineup are within the scope and the spirit of the present invention. FIG. 30b shows the magnet assembly lined up with the switch assembly (closed door) while Dome 310 and Shell 320 are aligned but Dome 10 and Shell 20 are not. As the door opens, Dome 310 and Shell 320 move out of alignment while Dome 10 and Shell 20 approach alignment as seen in FIG. 30c. As alignment implies maximum flux delivery from a Shell to its respective Dome, information about the flux intensity at each Dome sensor provides information about the degree of "door closure". This information can better define the threshold of alarm and reduce the "nuisance alarm" due to, for example, door closure tolerances. The degree of closure tightness can be determined continuously and more accurately when linear (analog) semiconductor magnetic sensors are used in the Domes 10 and 310.

Most of the embodiments of the present invention emphasize two-lead connectivity from each sensor to the premises control unit for the purpose of back compatibility with legacy wiring in existing facilities. However, when new wiring is considered such as, for example, in new installations, other multi-lead wiring approaches may be considered. These approaches, whether custom or standard (USB, etc.), are within the scope and spirit of the present invention. Furthermore, when in situ active circuits are used, as in case of USB connectivity, internal nonvolatile memory will register any pertinent occurrence, such as, but not limited to, power outage. While power and connectivity between the sensor and the premises control unit is intact, the sensor and its circuitry are regularly monitored for status and security. However, in the event that power and/or connectivity is temporarily disrupted, the premises control unit will retrieve from its nonvolatile record all important events at the sensor site.

Figure 26D:
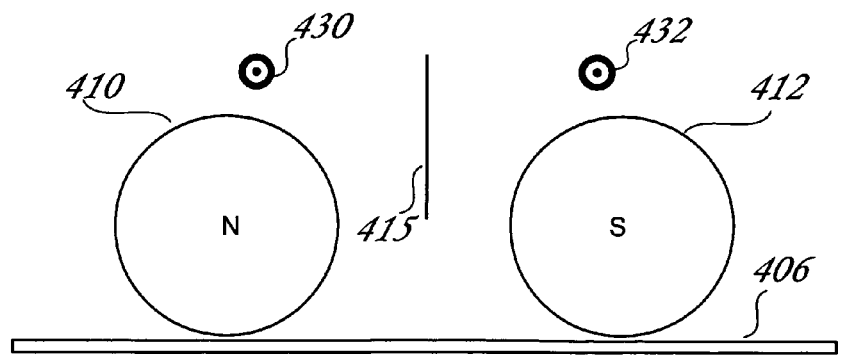
Figure 31:
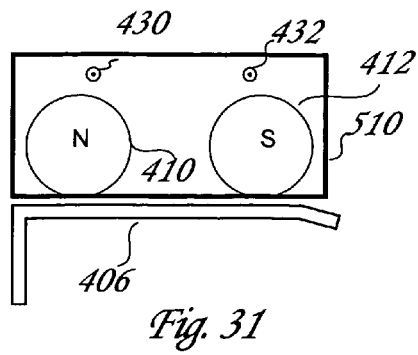
FIG. 31 illustrates an example of standalone hysteresis based proximity sensor.

FIG. 31 shows an example of a hysteresis based sensor of FIG. 26d when used independent of the Dome and Shell assemblies. In this illustration sensor 510 is complemented by a ferromagnetic plate 406 that can be mounted on a door, window, etc. Other shapes and mounting methods of the hysteresis based sensor 510 and ferromagnetic plate 406 are within the scope and spirit of the present invention.

Figure 32A:
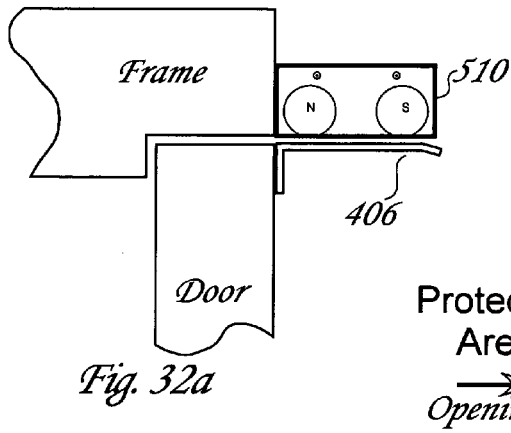
Figure 32B:
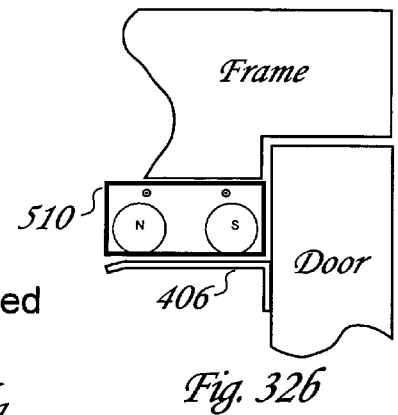
Figure 33C:
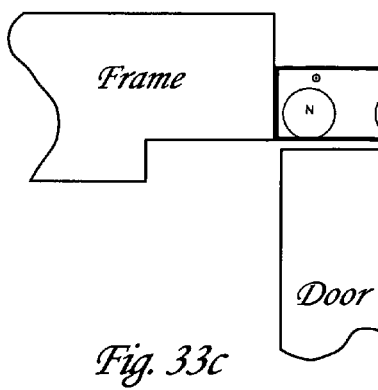
Figure 32D:
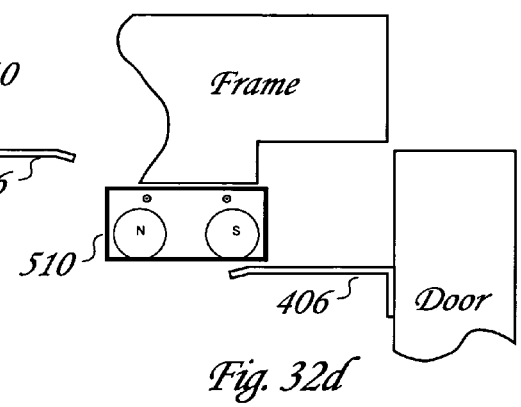

FIGS. 32a through 32d illustrate the hysteresis based sensor of 510 and the ferromagnetic plate 406 mounted on a door frame and a door respectively. FIGS. 32a and 32c show the relative position of the sensor 510 and the ferromagnetic plate when the door is closed and then when the door opens inward into the protected area. Whereas, FIGS. 32b and 32d show the relative position of the sensor 510 and the ferromagnetic plate when the door is closed and when the door opens outward from the protected area. Other applications of proximity sensing involving items and portals other than doors are within the scope and spirit of the present invention The use of mechanical anti-tamper precautions for both the Dome housing 110 and the Shell housing 120 are not precluded in the present invention and act as an additional means for anti-tamper protection. These precautions, such as the use of special fastening screws that are driven by special tools (not shown) and are resistive to removal (not shown), as well as wiring mechanical protection such as, but not limited to, conduits and/or steel jacket cable are within the scope of the present invention.

The invention claimed is:

1. An apparatus that features a hysteresis based magnetic proximity sensor which retains proximity disruption status comprising:

the said sensor proximate a ferromagnetic element and between the low and high threshold induction levels of the hysteresis in a secure state;

when sensor is not in proximity to the said ferromagnetic element and above the high threshold induction level it is tripped into an opposite state;

the said sensor restored to proximate the said ferromagnetic element and between the low and high threshold induction levels maintains the opposite state; and a device reducing said sensor's magnetic flux below the hysteresis low threshold induction level under external control while said sensor is proximate the said ferromagnetic element resets the sensor back to the secure state.

2. The apparatus of claim 1 wherein said magnetic sensor is equipped with a coil for reducing the induction below the low threshold level of the said sensor and restoring it to the secure state.

3. The apparatus of claim 1 wherein said magnetic sensor is equipped with a coil for modifying the sensor's induction level as part of integrity testing of the proximity sensor.

4. The apparatus of claim 1 wherein said magnetic sensor is equipped with a strategically placed ferromagnetic element for protecting the proximity sensor from external magnetic fields deemed interfering with the operation of the sensor.

5. The apparatus of claim 1 wherein the said sensor is equipped with a signal processor for enhancing the detected signal.

6. The apparatus of claim 1 wherein said magnetic sensor is equipped with a line impedance monitor for line tampering detection.

7. The apparatus of claim 1 wherein said magnetic sensor is equipped with a communications link between the proximity sensor and a control unit.

8. The apparatus of claim 1 wherein said magnetic sensor is a soft sensor and provides information on the degree of proximity.

9. The apparatus of claim 1 wherein said magnetic sensor is integrated within a stationary device for detection of movement attempt.

10. The apparatus of claim 1 wherein said magnetic sensor is a prime security proximity sensor.

11. A method of proximity detection using a hysteresis based sensor wherein:

a sensor between its hysteresis low and high threshold induction level is in the secure state while in proximity to a ferromagnetic element;

a change in proximity between the said sensor and the said ferromagnetic element brings the said sensor above the hysteresis high threshold induction level tripping the said sensor into an opposite state;

restoration of the said sensor proximate the said ferromagnetic element and between low and high threshold induction levels does not reverse the said sensor's state; and when reducing said sensor's magnetic flux below the low threshold level under external control while said sensor is proximate the said ferromagnetic element, resets the said sensor back to secure state.

12. The method of claim 11 wherein an external action of reducing the said sensor's magnetic flux below the low threshold level is accomplished by energizing a coil around the sensor.

13. The method of claim 11 wherein an external action of modifying the sensor's magnetic flux is accomplished by energizing a coil around the sensor for sensor integrity testing.

14. The method of claim 11 wherein a strategically placed ferromagnetic element protects the proximity sensor from interference by external stray magnetic fields.

15. The method of claim 11 wherein signal processing enhances the detected signal of the said sensor.

16. The method of claim 11 wherein a line impedance is monitored for line tampering detection.

17. The method of claim 11 wherein a communications link is established between the said proximity sensor and a control unit.

18. The method of claim 11 wherein a soft sensor determines the degree of proximity of the said sensor and the ferromagnetic element.

19. The method of claim 11 wherein detection of a movement attempt of a stationary object is accomplished by said proximity sensor.

20. The method of claim 11 wherein the said magnetic sensor is used as a prime security proximity sensor.

\* \* \* \* \*